United States Patent [19]

Imamura

[11] Patent Number: 4,713,357

[45] Date of Patent: Dec. 15, 1987

[54] METHOD OF MAKING A CAPACITOR WITH REDUCED DIELECTRIC BREAKDOWN

[75] Inventor: Toru Imamura, Kumamoto, Japan

[73] Assignee: NEC Corporation, Tokyo, Japan

[21] Appl. No.: 553,944

[22] Filed: Nov. 21, 1983

[30] Foreign Application Priority Data

Nov. 19, 1982 [JP] Japan .............................. 57-203400

[51] Int. Cl.⁴ .................... H01L 21/265; H01L 21/28
[52] U.S. Cl. ...................................... 437/52; 437/60;
437/228; 437/238; 357/51; 357/59
[58] Field of Search .................... 29/571, 577 C, 589,
29/590, 591; 357/51, 59; 148/1.5, DIG. 14, 131

[56] References Cited

U.S. PATENT DOCUMENTS

| | | | |
|---|---|---|---|
| 4,202,001 | 6/1980 | Reichert et al. | 357/22 |
| 4,234,889 | 11/1980 | Raymond, Jr. et al. | 357/59 |
| 4,240,195 | 12/1980 | Clemens et al. | 29/590 |
| 4,290,186 | 9/1981 | Klein et al. | 29/576 B |
| 4,322,736 | 3/1982 | Sasaki et al. | 357/59 |
| 4,455,739 | 6/1985 | Hynecek | 29/577 C |
| 4,543,597 | 9/1985 | Shibata | 357/59 |
| 4,551,908 | 11/1985 | Nagasawa et al. | 29/571 |

OTHER PUBLICATIONS

Huntsmans, "Proper Shielding Protects ICs from Electrostatic Damage", Electronics, Jul. 14, 1982.
Yoshida et al, "Gate Breakdown Phenomena During RIE Process", IEE of Japan, Proceedings of Symposium on Dry Process, Sep. 19-20, 1983.
Deliduka et al, "Monolithic Integrated Circuit Fuse Link", IBM Tech. Discl. Bull., vol. 19, No. 4, Sep. 76.

*Primary Examiner*—Brian E. Hearn
*Assistant Examiner*—William Bunch
*Attorney, Agent, or Firm*—Sughrue, Mion, Zinn, Macpeak, and Seas

[57] ABSTRACT

In a semiconductor device having a thin insulating film of 300 Å or less in thickness on which a conductive layer is provided, the conductive layer is connected to the semiconductor substrate at a position outside the active regions. With such a structure, negative charges accumulated on the conductive layer during the reactive ion etching or ion implantation process can be easily discharged to the semiconductor substrate to prevent a dielectric breakdown of the thin insulating film. In the embodiment, the thin insulating film is a dielectric film of a MOS storage capacitor of a one-transistor type memory cell and the conductive layer is the upper electrode of the MOS capacitor.

8 Claims, 6 Drawing Figures

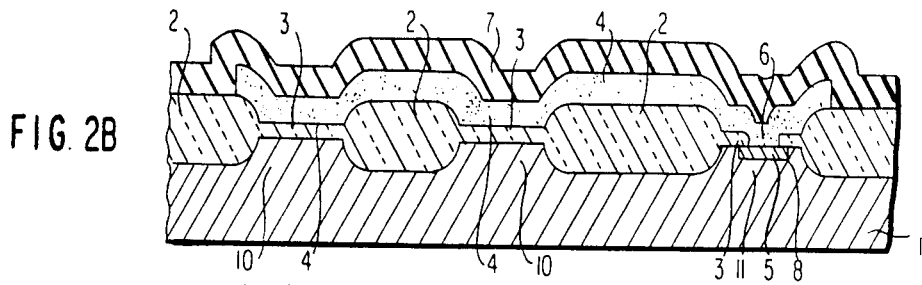
FIG. 2B
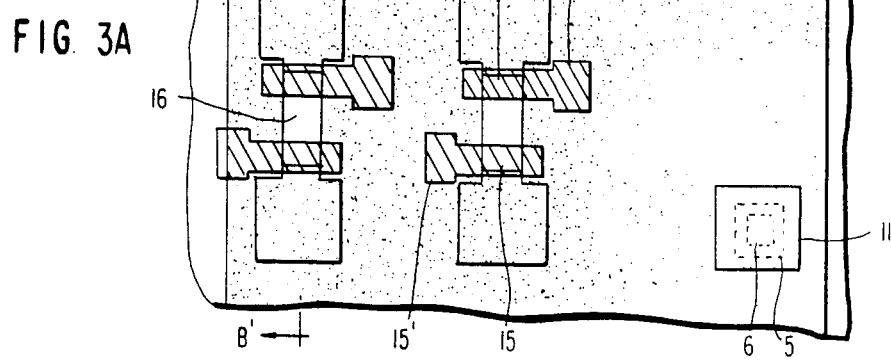
FIG. 3A
FIG. 3B
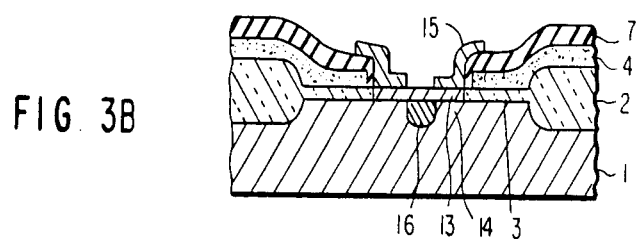
FIG. 4
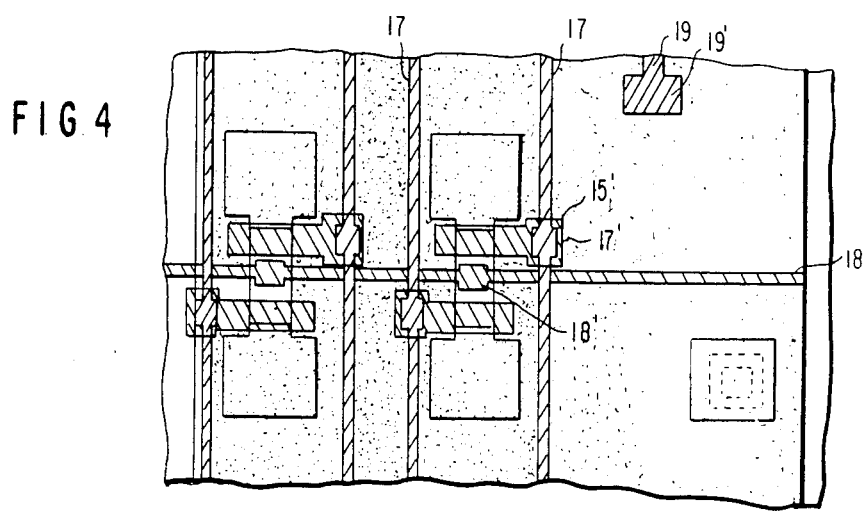

METHOD OF MAKING A CAPACITOR WITH REDUCED DIELECTRIC BREAKDOWN

BACKGROUND OF THE INVENTION

The present invention relates to a semiconductor device, and more particularly, to a semiconductor memory device in which each individual memory cell is formed of a single transistor and a capacitive storage unit.

The capacitive storage unit of the semiconductor memory device is generally a MOS capacitor composed of a semiconductor substrate as a lower electrode, a thin insulating film on the semiconductor substrate as a dielectric film, and a conductive layer on the this insulating film as an upper electrode. The sandwiched insulating film may be silicon oxide, silicon oxide and silicon nitride and the upper electrode may be made of polycrystalline silicon, aluminum, molybdenum, or Al-Si alloy.

For the semiconductor memory device of the mentioned type, the requirements of high integration density and microfabrication have recently been more and more increased. For meeting such requirements, the size of the MOS capacitor have to be compact without decreasing its capacitance. For this purpose, the dielectric film of the MOS storage capacitor must be made thinner.

If the dielectric film is thinned to 300 Å or less, however, it cannot withstand an anomalously high electric field which is induced during the manufacturing process between the upper electrode of the MOS capacitor and the semiconductor substrate as the lower electrode. The inducement of the anomalously high electric field is caused by static charges which are generated during the reactive ion etching process for forming the gate electrode after formation of the upper electrode of the MOS capacitor and during the ion implantation to form the source and drain regions by using the gate electrode as a mask, and accumulated on the semiconductor substrate and on the upper electrode of the MOS capacitor. During the reactive ion etching, for example, the surface of the semiconductor substrate is positively charged while the upper electrode of the MOS capacitor is negatively charged. A potential difference of 20 to 50 volts is thereby generated between the upper and lower electrodes of the MOS capacitor and this potential difference breaks down the dielectric film of the MOS capacitor. This lowers the yield and the reliability of the semiconductor memory device.

SUMMARY OF THE INVENTION

Therefore, an object of the present invention is to provide a structure and its fabrication method of a semiconductor device which can prevent the breakdown of the thin insulating film caused by the static charges accumulated during the fabrication processes.

Another object of the present invention is to provide a semiconductor memory device and its manufacturing method enabling an improved yield and high reliability by preventing a dielectric breakdown of the MOS storage capacitor.

According to the feature of the present invention, there is provided a semiconductor device comprising a semiconductor substrate of one conductivity type, a thin insulating film provided on one major surface of the semiconductor substrate, and a conductive film formed on the thin insulating film and connected to an impurity region of the opposite conductivity type formed in the semiconductor substrate at a position outside the element regions.

According to another feature of the present invention, there is provided a semiconductor memory device comprising a plurality of memory cells, each memory cell including an MOS transistor and an MOS capacitor, the capacitor having a part of a semiconductor substrate as the lower electrode, a thin insulating film as a dielectric film formed on the part of the semiconductor substrate and a conductive layer as the upper electrode formed on the thin insulating film and connected to an impurity region in the semiconductor substrate positioned outside the regions where the MOS transistors and the MOS capacitors are formed.

The insulating film may be a silicon dioxide film or a double-layered film of silicon dioxide and silicon nitride, and the conductive film may be made of polycrystalline silicon, aluminum, mohybdenum, Al-S$_i$ alloy, or metal silicide. Where the semiconductor device is an N-channel silicon-gate MOS memory device, the semiconductor substrate is generally a P-type silicon and the conductive layer is made of N-type polycrystalline silicon, the impurity region being of N-type. The N-type impurity region may be formed by introducing impurities of N-type from the polycrystalline silicon to the P-type silicon substrate, or by another process. The PN junction formed between the impurity region and the substrate provides a forward direction path for the negative charges generated by plasma-etching or reactive ion etching and accumulated on the upper electrode of the MOS capacitor. Therefore, the accumulated charges can be safely discharged through the PN junction of the impurity region to the semiconductor substrate. Therefore, a dielectric breakdown of the thin insulating film can be prevented. On the other hand, the N-channel silicon-gate MOS memory device is generally used with a positive potential, +5 V for example, applied to the upper electrode and a negative potential, −5 V for example, applied to the semiconductor substrate. With these potentials, the PN junction of the impurity region is biased in the reverse direction, and the operation of the memory device is not adversely affected by the presence of the impurity region.

In the manufacturing process of the semiconductor memory device, the static charges are accumulated as mentioned, when the upper electrode of the capacitor is shaped by the reactive ion etching. If the upper electrode of the capacitor is not required to have a high dimensional accuracy in its shape, isotropic chemical etching can be used and in that case, the undesired charges are not generated. However, the gate electrode, which is generally formed after the formation of the upper electrode of the MOS capacitor, necessitates a very high dimensional accuracy in its planar shape. Therefore, the gate electrode must be shaped not by isotropic chemical etching which tends to over etch the portion covered by the mask, but by the reactive ion etching which is an anisotropic etching which never etches the covered portion. During the reactive ion etching for the gate electrode formation, negative charges are accumulated on the upper electrode of the capacitor. Also, the upper electrode of the capacitor is charged when the source or drain region is formed by ion implantation using the gate electrode as a mask. As a practical matter, dielectric breakdown caused by the accumulated charges occurs when the insulating film, that is a dielectric film of the capacitor, is 300 Å or less in thickness. Therefore, the present invention is quite effective when the thickness of the insulating film is 300 Å or less.

According to another aspect of the present invention, there is provided a method of manufacturing a semiconductor device which comprises the steps of depositing a conductive film on a thin insulating film covering the surface of a semiconductor substrate such that the conductive film is contacted with the semiconductor substrate at a position where the thin insulating film is not present, and performing an ion implantation into said substrate or a reactive ion etching of the deposited conductive film or of another film on the deposited conductive film whereby electrical charges which are accumulated in the conductive film during the ion implantation or the reactive ion etching are discharged to the semiconductor substrate.

BRIEF DESCRIPTION OF THE DRAWINGS

FIGS. 1, 2A, 3A, and 4 are plan views showing the preferred embodiment of the present invention in its fabrication process sequence.

FIGS. 2B and 3B are the cross-sectional views taken along the line B-B' in FIG. 2A and 3A, respectively, as viewed in the direction of the arrows.

DESCRIPTION OF THE PREFERRED EMBODIMENT

In a preferred embodiment, the present invention is applied to a semiconductor memory device in which each individual memory cell is formed of a single MOS transistor and a MOS capacitor storage unit.

Figure 1:
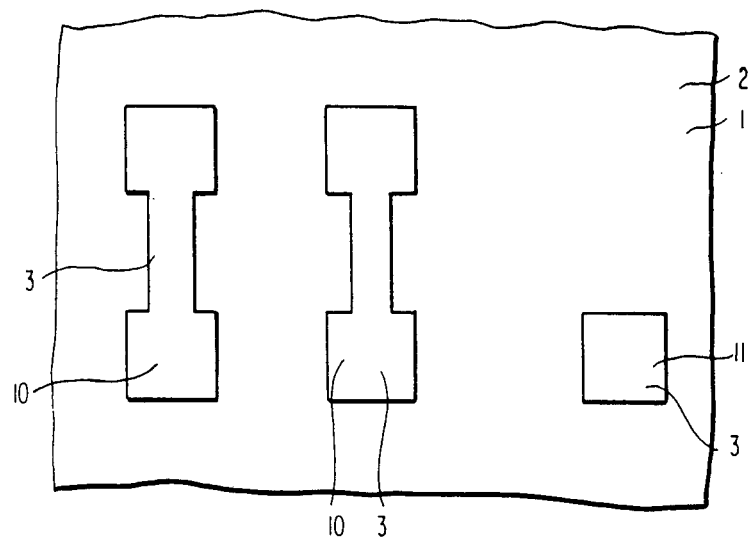
Figure 2A:
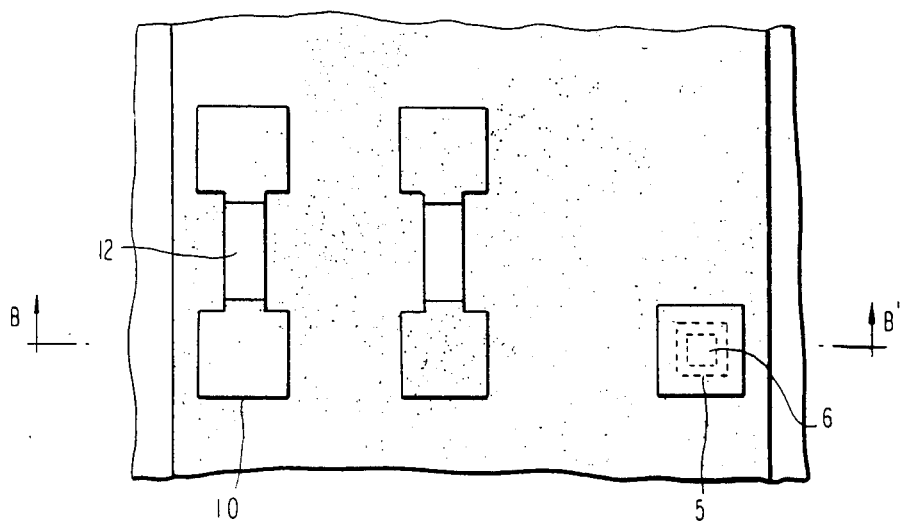

Referring to FIG. 1, FIG. 2A and FIG. 2B, a thick field insulating layer 2 is formed on a selected portion of the surface of a P-type silicon substrate 1 having an impurity concentration of $1 \times 10^{16}$ atoms/cm$^3$, except for its surface portions at a plurality of collar-bone like active regions 10 and a contact region 11 of the present invention. Practically, a plurality of the collar-bone like active regions are formed in a matrix. However, to simplify the drawings, only two of them are illustrated. Each individual active region will contain two memory cells. A thin insulating film 3 of 200 Å in thickness is formed on the surface of these active regions 10 and the contact region 11. The thin insulating film 3 is composed of a silicon dioxide lower film of 50 Å in thickness and a silicon nitride upper film of 150 Å in thickness. Portions of the thin insulating film 3 on broadened end areas of the active region 10 become dielectric films of the MOS capacitors of the memory cells.

Referring to FIGS. 2A and 2B, a square aperture 6 is opened in thin insulating film 3 on the contact region 11 by using a photoresist (not shown) as a mask. The length of one side of the square aperture 6 is 3 to 10 μm. Phosphorus is introduced through the aperture 6 into the contact region 11 of the substrate to form an N-type impurity region 5 of an impurity concentration of $1 \times 10^{20}$ atoms/cm$^3$ in the contact region 11 with a PN junction 8 formed between the impurity region 5 and the substrate 1. Next, a polychrystalline silicon layer 4 having a thickness of 0.8 μm and doped with phosphorus is deposited over the surface of the thin insulating film 3, over the field insulating layer 2, and in the aperture 6 to contact with the N-type impurity region 5. Thereafter, the chemical etching is performed by using a photoresist (not shown) as a mask to selectively remove the polycrystalline silicon layer 4 from respective narrow center areas 12 of the collar bone-shaped active regions 10 that will become channel regions and source or drain regions of MOS transistors of the memory cells and from areas outside the memory cell matrix, leaving the dotted area of the polycrystalline silicon layer 4 (see FIG. 2A) which include the upper electrodes of the capacitors on the their insulating film 3 on the capacitor areas of the active regions 10, a connecting portion on the thick field insulating layer 2, and a contact portion connected to the region 5. In other words, the upper electrodes 4 of the N-type polycrystalline silicon of the capacitors are connected to each other and in common to the N-type impurity region 5. Instead of forming the N-type impurity region 5 before the deposition of the polycrystalline silicon layer 4, that region 5 may be formed after the deposition of the N-type polycrystalline silicon layer 4, by introducing the N-type impurity into the contact region 11 from the doped N-type polycrystalline silicon layer which is contacted through the aperture 6 to the contact region 11, or from the outside through the polycrystalline silicon layer. The reactive ion etching can be employed instead of the chemical etching for shaping the capacitor electrode 4. In that instance, the charges can escape to the semiconductor substrate through to N-type impurity region 5, and therefore, the thin insulating film 3 is protected against a dielectric breakdown.

Referring to FIGS. 3A and 3B, a silicon oxide film 7, approximately 0.4 μm thick, is formed on the left polycrystalline silicon layer including the capacitor electrode 4 by the thermal oxidation. After this process, the polycrystalline silicon becomes thinner to approximately 0.5 μm and is completely coated with the silicon oxide film 7. During this thermal oxidation process, the insulating film 3, with a silicon nitride layer on its top layer, placed on the center part 12 of the active region 10 is not thermally oxidized. The insulating film 3 of this center part 12 is then removed, and thermal oxidation is performed to newly form a silicon dioxide film 13 to a thickness of 500 Å as a gate insulating film on the channel region 14 (FIG. 3B). Next, a polycrystalline silicon having a thickness of 0.8 μm and doped with phosphorus, or not doped with an impurity, is deposited on the insulating film 13, on the silicon oxide film 7 above the capacitor electrode 4 and on the thick insulating layer 2, and then selectively etched to form gate electrodes 15 having its contact regions 15' represented by diagonal lines shown in FIG. 3A. These gate electrodes must be shaped with a good accuracy. For this reason, for example, reactive ion etching which is an anisotropic etching process is employed by using a photoresist (not shown) as a mask in a carbon tetrachloride (CCl$_4$) atmosphere at 1.0 to 100 mm (TORR) with an RF power at approximately 1000 W. Using this method, side-etching that is inevitable in chemical etching can be omitted. In the present invention, the upper electrode 4 of the capacitor is connected to the N-type impurity region 5 through the aperture 6. Therefore, negative charges induced in the electrode 4 during this reactive ion etching for forming the gate electrodes 15 are easily discharged to the semiconductor substrate 1 as the PN junction 8 formed by the N-type impurity region 5 and the P-type semiconductor substrate 1 has a forward direction relationship. Therefore, a dielectric breakdown of the thin insulating film 3 of the capacitor does not take place.

Next, using these gate electrodes 15 as masks, phosphorus is ion implanted to form N-type impurity regions 16 with an impurity concentration of $1 \times 10^{20}$ atoms/cm$^3$. These impurity regions become a source or drain region 16. At this time, the N-type impurity is also introduced into the gate electrodes 15. This ion implantation is performed at 50 keV and in dosage of $10^{15}$ to $10^{16}$/cm$^2$ as an example. In this instance also, as mentioned above, the charges are discharged to the semiconductor substrate via the region 5 and therefore, dielectric breakdown of the insulating film 3 in the capacitor can be prevented. On the other hand, the gate insulating film 13 under the gate electrodes is immune to a breakdown during the above-mentioned reactive ion etching or ion implantation process because the gate insulating film 13 is 500 Å or more in thickness. Moreover, the probability of a dielectric breakdown of the gate insulating film is very small because of the small channel area, 10 μm$^2$, compared with the area of the capacitor of 60 μm$^2$ as an example.

Next, a passivation film (not shown) is formed by vapor phase growth, or by other method, and contact holes (not shown) are formed in the passivation film. Word lines 17 made of aluminum or polycrystalline silicon are connected at their contact parts 17' with the contact regions 15' of the gate electrodes, as shown in FIG. 4, through the contact holes and extends in one direction. By a similar method, bit lines 18 are formed to contact at the contact parts 18' to the N-type impurity regions 16 through the contact holes and extend perpendicularly to the direction of the word lines. Also, aluminum wiring 19 is led out to the capacitor electrode 4 at its contact part 19' through contact hole opened in the passivation film and the silicon oxide film 7 and extends in the one direction. The capacitor electrode 4 is applied with a voltage of +5 V through the wiring 19, for example, and the semiconductor substrate 1 is applied with a voltage of −5 V. Since the PN junction of the N-type impurity region 5 has a breakdown voltage of 20 to 25 V, it withstands the backward - bias voltage of 10 V applied thereto.

The above description describes the use of polycrystalline silicon on a thin insulating film. The same effect can also be expected when a metal film such as an aluminum film is provided on the thin insulating film. Also, the polycrystalline silicon is described to be subjected to the reactive ion etching. The same effect can also be expected when aluminum film, another metal film, or an insulating film is etched by the reactive ion etching. The PN junction of the contact region for the conductive film on the thin insulating film can be omitted, that is, the conductive film can be directly contacted to the substrate, if the contacted portion of the conductive film is cut off from the major portion of the conductive film after treatments in the flow of ions such as the reactive etching process and the ion implanting process are completed.

What is claimed is:

1. A method of manufacturing a semiconductor device comprising the steps of selectively forming a thick field insulating layer on one major surface of a semiconductor substrate of one conductivity type excluding active regions and a predetermined region outside said active regions, forming a thin insulating film of 300 Å or less in thickness on at least a part of said active regions, forming a first conductive film continuously on said thin insulating film, on said field insulating layer, and on said predetermined region of said semiconductor substrate to contact with said semiconductor substrate, forming an insulating layer on said first conductive film, and forming a second conductive film on said insulating layer, whereby electrical charges are accumulated in said first conductive film and discharged through said predetermined region to said semiconductor substrate.

2. A method of manufacturing a semiconductor device of claim 1, in which said first conductive film is made of polycrystalline silicon of the opposite conductivity type.

3. A method of manufacturing a semiconductor device of claim 1, further comprising the step, before forming said first conductive film, of forming an impurity region of the opposite conductivity type in said predetermined region of said semiconductor substrate of the one conductivity type, said first conductive film being contacted with the surface of said impurity region.

4. A method of manufacturing a semiconductor device of claim 1, in which said first conductive film is used as an upper electrode of a capacitor, and said thin insulating film is used as a dielectric film of said capacitor.

5. A method of manufacturing a semiconductor device of claim 1, in which said second conductive film is made of polycrystalline silicon.

6. A method of manufacturing a semiconductor device of claim 1, further comprising the step of forming an impurity region of the opposite conductivity type in said predetermined region of said semiconductor substrate of the one conductivity type, after forming said first conductive film, by introducing the impurity of the opposite conductivity type into said predetermined region of said semiconductor substrate from said first conductive film.

7. A method of manufacturing a semiconductor memory device having a plurality of memory cells, each of memory cells including a capacitive storage unit, said method comprising the steps of:
   selectively forming a thick field insulating layer on a surface of a semiconductor substrate except for active regions of said substrate and a contact portion of said substrate outside said active regions,
   selectively forming a thin insulating film as a dielectric film of said capacitive storage unit on said surface of said substrate in said active regions,
   forming a conductive film on said thin insulating film as an upper electrode of said capacitive storage unit, and on said thick field insulating layer and connected to said contact portion of said substrate, said first conductive film being continuously formed on a whole part of said field insulating layer positioned between said contact portion and said thin insulating film in the nearest active region to said contact portion,
   forming an insulating layer on said first conductive film, and
   forming a second conductive film on said insulating layer,
   whereby electrical charges are accumulated in said first conductive film are discharged through said contact portion to said semiconductor substrate.

8. A method of manufacturing a semiconductor device comprising the steps of:
   selectively forming a thick field insulating layer on one major surface of a semiconductor substrate of one conductivity type excluding active regions and a predetermined region outside said active regions,
   forming a thin insulating film of 300 Å or less in thickness on at least a part of said active regions, forming a continuous first conductive film on said thin insulating film, on said field insulating layer, and on said predetermined region of said semiconductor substrate to contact with said semiconductor substrate, forming an insulating layer on said first conductive film, and forming a second conductive film on said insulating layer, whereby electrical charges are accumulated in said first conductive film and discharged through said predetermined region to said semiconductor substrate.

* * * * *

UNITED STATES PATENT AND TRADEMARK OFFICE
CERTIFICATE OF CORRECTION

PATENT NO. : 4,713,357
DATED : December 15, 1987
INVENTOR(S) : IMAMURA

It is certified that error appears in the above-identified patent and that said Letters Patent is hereby corrected as shown below:

COLUMN 2, LINE 19    Delete "mohybdenum" and add --molybdenum--;

COLUMN 4, LINE 7     After "capacitors on" delete "their";

COLUMN 6, LINE 59    Delete "are" and add --and--.

Signed and Sealed this

Twentieth Day of September, 1988

Attest:

DONALD J. QUIGG

*Attesting Officer*   *Commissioner of Patents and Trademarks*